United States Patent [19]
Adrian

[11] Patent Number: 5,654,216
[45] Date of Patent: Aug. 5, 1997

[54] FORMATION OF A METAL VIA STRUCTURE FROM A COMPOSITE METAL LAYER

[75] Inventor: Ng Choon Seng Adrian, Singapore, Singapore

[73] Assignee: Chartered Semiconductor Manufacturing Pte Ltd., Singapore, Singapore

[21] Appl. No.: 630,708

[22] Filed: Apr. 8, 1996

[51] Int. Cl.$^6$ .................................................. H01L 21/283
[52] U.S. Cl. ......................................... 438/627; 438/633
[58] Field of Search ............................... 437/189, 190, 437/192, 194, 195, 228, 415 M; 257/751, 752, 758, 760

[56] References Cited

U.S. PATENT DOCUMENTS

| | | | |
|---|---|---|---|
| 4,917,759 | 4/1990 | Fisher et al. | 156/643 |
| 5,114,874 | 5/1992 | Custode | 437/57 |
| 5,262,354 | 11/1993 | Cote et al. | 437/195 |
| 5,312,512 | 5/1994 | Allman et al. | 156/636 |
| 5,358,901 | 10/1994 | Fiozdalice et al. | 437/192 |
| 5,393,703 | 2/1995 | Olowolafe et al. | 437/197 |

Primary Examiner—T. N. Quach
Attorney, Agent, or Firm—George O. Saile

[57] ABSTRACT

A process for creating narrow, metal via structures, used to connect metallization levels, has been developed. The process features initially forming a narrow, metal via structure, and then an underlying interconnect metallization structure, from a single, composite metallization layer. The composite metallization layer is composed of conductive layers, with a specific layer used as an etch stop, allowing creation of a narrow metal via structure, from the top layer of the composite metallization layer, without disturbing the bottom layers. The bottom layers of the composite metallization layer are then patterned to create the underlying interconnect metallization structure.

30 Claims, 4 Drawing Sheets

FORMATION OF A METAL VIA STRUCTURE FROM A COMPOSITE METAL LAYER

BACKGROUND OF THE INVENTION (1) Field of the Invention

This invention relates to the fabrication processes use to create semiconductor devices, and more specifically to methods used to create metal via structures, used to interconnect overlying and underlying metallization levels.

(2) Background of the Invention

The semiconductor industry is continually striving to increase the performance of semiconductor devices, while still maintaining, or decreasing, the manufacturing cost of these same semiconductor devices. These objectives have been successfully addressed by the ability of the semiconductor fabrication community to successfully create silicon devices with specific sub-micron features. The advent of micro-miniaturazation, or the use of sub-micron features, has largely been accomplished by advances in several semiconductor fabrication disciplines, specifically photolithograhy and anisotropic dry etching. The development of more sophisticated exposure cameras, as well as the use of more sensitive photoresist materials, have resulted in sub-micron images in photoresist layers being routinely obtained. In addition similar advances in dry etching, or reactive ion etching, (RIE), have allowed the sub-micron images in photoresist layers, to be successfully transferred to underlying materials, used for the construction of silicon devices. The use of sub-micron features results in decreases in parasitic capacitances, as well as resistance decreases, both providing performance benefits. In addition the smaller features allow a greater number of smaller silicon chips to be obtained from a specific size starting wafer, thus reducing the manufacturing cost for individual chips.

The use of semiconductor chips, fabricated with sub-micron features, does however create specific areas of concern, not encountered with semiconductor chips, fabricated with less aggressive designs. For example, metal filled via holes, used to interconnect metallization levels, are more difficult to form, and fill, when using sub-micron designs. Via holes, with sub micron diameters, are difficult to fill with conventional metallization deposition techniques, such as sputtering or evaporation. The high aspect ratio of the via hole, that is the depth of the via, divided by the diameter of the via opening, requires a low pressure chemical vapor deposition, (LPCVD) process for adequate via hole filling. Since it is difficult to deposit aluminum based metallizations, using LPCVD, the semiconductor industry has used LPCVD tungsten to fill these high aspect ratio via holes. However even with the use of LPCVD tungsten, several shortcomings still exist. For example since the LPCVD fill of a via hole proceeds by tungsten depositing on the sides of the via hole, a seam or imperfection can exist in the center of the tungsten filled via, at the point of convergence of the depositing layers. This seam, when subjected to RIE etch back processes, used to remove unwanted tungsten from areas of the silicon device, other than the via hole, can evolve into a larger seam or defect, making it difficult for subsequent overlying metallizations to successfully cover. Thus overlying metallizations, thin in areas overlying the enlarged seam, may experience higher current densities than desired, and possibly resulting in electromigration failure.

This invention will describe a process for creating metal vias, or studs, using the approach of initially forming the metal via, then performing the processes needed for dielectric passivation. Therefore the difficulties of forming a narrow diameter via in a dielectric layer, filling with a metal, and etching back, are avoided. Therefore this approach can use the higher conductivity, aluminum metallization, obtained using the now acceptable r.f sputtering procedure. This approach has been offered by Fisher, et al, in U.S. Pat. No. 4,917,759, and Allman, et al, in U.S. Pat. No. 5,312,512, in which emphasis is placed on filling narrow spaces between metal via studs, with dielectric material. However this invention will describe and feature a novel process in which both an underlying interconnect metallization structure, and a metal via stud, are formed from one composite metal layer, using two photolithographic, and two RIE processes.

SUMMARY OF THE INVENTION

It is an object of this invention to create a narrow metal via structure, and an underlying interconnect metallization structure, from a single composite metallization layer.

It is another object of this invention to produce a composite metallization layer, composed of a specific underlying and overlying conductive layer, exhibiting a specific removal rate for a specific dry etch chemistry, and separated by a different conductive layer, exhibiting a slower etch rate, than the overlying and underlying conductive layers, for that same specific dry etch chemistry.

It is still another object of this invention to fill the narrow spaces between metal via structures, and between underlying interconnect metallization structures, using a composite dielectric layer, with a n insulator layer such as a spin-on-glass layer, to be used as part of the composite dielectric layer.

It is still yet another object of this invention to planarize the composite dielectric layer, using chemical mechanical polishing, prior to formation of an overlying interconnect metallization structure.

In accordance with the present invention a method is described for creating a metal via structure, and an underlying interconnect metallization layer, by patterning and etching a composite metallization layer, using part of a composite metallization layer as an etch stop. A composite, metallization layer, composed of an underlying barrier layer, an underlying conductive layer, another thin barrier layer, to be used for a subsequent etch stop, and an overlying conductive layer, is deposited on a structure, in which an underlying active device region in a semiconductor substrate, is exposed. Photolithographic patterning, and dry etching are used to define a metal via structure in the overlying conductive layer of the composite metallization layer. After photoresist removal, another photolithographic patterning and dry etching procedure are employed to define an underlying interconnect metallization structure from the thin barrier layer, from the underlying conductive layer, and from the underlying barrier layer of the composite metallization layer. After photoresist removal a composite dielectric layer is used to fill the spaces between metal via structures, and between underlying interconnect metallization structures. A chemical mechanical polishing procedure is next used for planarization purposes, exposing the top surface of the metal via structure. Another barrier layer, and another conductive layer are deposited and patterned, using photolithographic and dry etching procedures, used to create an overlying interconnect metallization structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating metal via structures and underlying interconnect structures, from a composite metallization layer, and filling the spaces between these structures with a composite insulator, will now be covered in detail. This invention can be used in the fabrication of metal oxide semiconductor field effect transistors, (MOSFET), devices, that are currently being manufactured in industry, therefore only specific areas, unique to understanding this invention, will be covered in detail.

Figure 1:
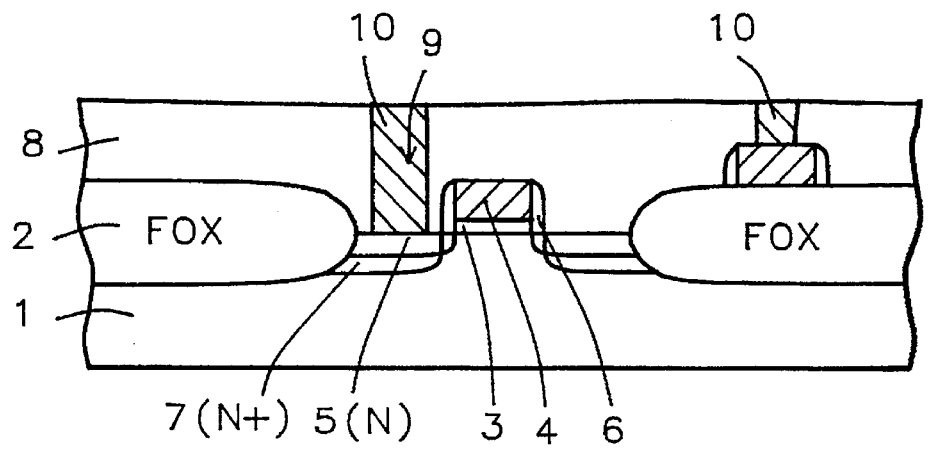
FIG. 1, which schematically shows a silicon device structure, prior to the deposition of the composite metallization layer.

FIG. 1, schematically shows a typical, N channel, (NFET), device, that this invention can be applied to. A substrate, 1, composed of single crystalline silicon, with a <100> crystallographic orientation, is used. Thick field oxide regions, (FOX), 2, are created, for isolation purposes. The FOX regions are produced by first patterning a silicon nitride-silicon dioxide, composite insulator, using conventional photolithographic and reactive ion etching, (RIE), procedures. After photoresist removal the composite insulator pattern is used as an oxidation mask to allow between about 4000 to 6000 Angstroms of silicon dioxide to be thermally grown in non-masked regions. After removal of the oxidation masking composite, using hot phosphoric acid for the silicon nitride layer, and a buffered hydrofluoric acid solution for the underlying silicon dioxide layer, a thin silicon oxide layer, 3, is grown at a temperature between about 800° to 1000° C., to a thickness between about 50 to 300 Angstroms, in an oxygen-steam ambient, to serve as the gate insulator of the MOSFET device. A polysilicon layer is next deposited using LPCVD processing, at a temperature between about 500° to 700° C., to a thickness between about 1500 to 4000 Angstroms. The polysilicon can be grown using in situ doping techniques, by adding either arsine or phosphine to a silane ambient. The polysilicon layer can also be deposited intrinsically, and then doped via ion implantation of either arsenic or phosphorous, at an energy between about 50 to 100 Kev., at a dose between about 1E15 to 1E16 atoms/cm$^2$. Standard photolithographic and RIE processing, using Cl$_2$ as an etchant, are used to create polysilicon gate structures, 4, shown schematically in FIG. 1.

After photoresist removal using plasma oxygen ashing and careful wet cleans, an N type, lightly doped source and drain region, 5, is formed in semiconductor substrate, 1, via ion implantation of phosphorous, at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), processing, at a temperature between about 500° to 800° C., to a thickness between about 1500 to 4000 Angstroms, using tetraethylorthosilicate as a source. An anisotropic, RIE procedure, using CHF$_3$ as an etchant, is used to form insulator sidewall spacer, 6, shown schematically in FIG. 1. Another ion implantation procedure, using arsenic at an energy between about 50 to 100 Kev., at a dose between about 1E14 to 5E15 atoms/cm$^2$, is used to create heavily doped, N type, source and drain regions, 7, in semiconductor substrate, 1.

Another silicon oxide layer, 8, is deposited using either LPCVD or PECVD processing, at a temperature between about 500° to 800° C., to a thickness between about 5000 to 10000 Angstroms. Silicon oxide layer, 8, is subjected to a chemical mechanical polishing procedure, used to create a planar topography. Photolithographic and RIE procedures, again using CHF$_3$ as an etchant, are next used to open contact hole, 9, exposing the top surface of source and drain region, 7, and polysilicon gate structure, 4. After photoresist removal, using plasma oxygen ashing and careful wet cleans, a LPCVD deposition of tungsten is performed, at a temperature between about 400° to 500° C., to a thickness between about 4000 to 6000 Angstroms, completely filling contact hole, 9. A RIE procedure, using Cl$_2$, or SF$_6$, as an etchant, is used to remove unwanted tungsten from the top surface of silicon oxide layer, 8, creating tungsten plug, 10, shown schematically in FIG. 1.

Figure 2:
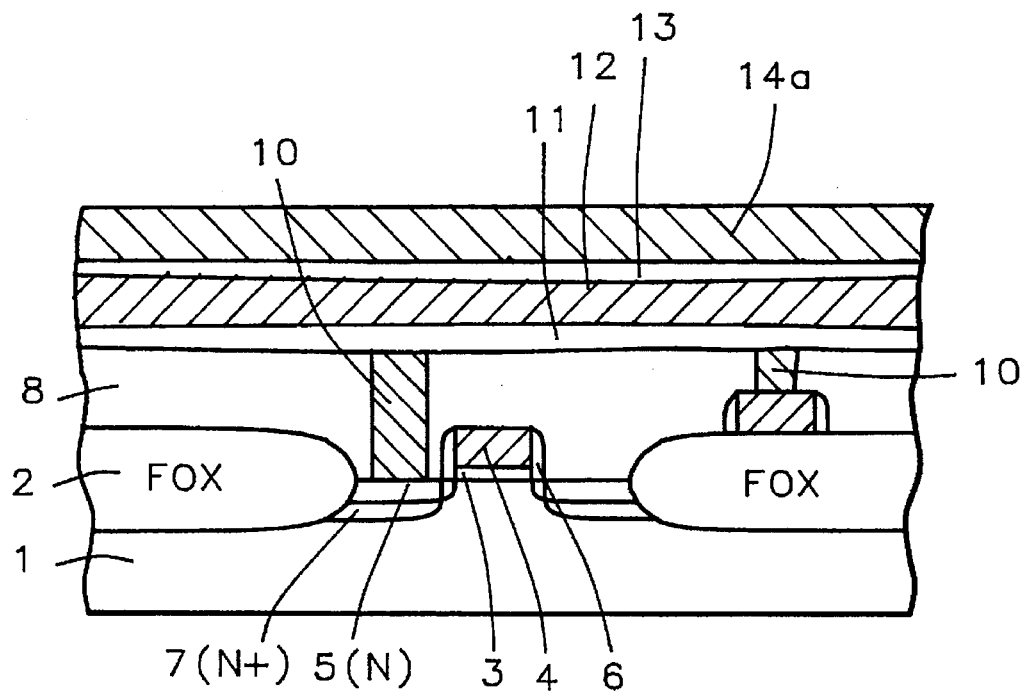
FIG. 2, which schematically shows the composite metallization layer overlying the silicon device structure.

A major feature of this invention, a composite metallization layer, is next deposited, and shown in FIG. 2. After a pre-clean, consisting of a buffered hydrofluoric acid dip, for a time between about 10 to 60 seconds, for purposes of removing any native oxide from the exposed top surface of tungsten plug, 10, a barrier layer of titanium nitride, 11, is deposited using r.f. Sputtering, to a thickness between about 500 to 1200 Angstroms. If desired an alternative, using a titanium-tungsten barrier layer, can be substituted for titanium nitride layer, 11. Next an aluminum based layer, 12, containing between about 0.5 to 1.0% copper, and between about 0.5 to 1.0% silicon, is deposited on underlying titanium nitride layer, 11, via r.f. sputtering, to a thickness between about 4000 to 10000 Angstroms. A layer of titanium-tungsten, (TiW), 13, is then deposited, again using r.f. sputtering techniques, to a thickness between about 300 to 600 Angstroms. This critical layer will be used as an etch stop for the definition of a subsequent, overlying aluminum layer, used to form a metal via structure. Therefore the removal rate of TiW layer, 13, in relation to the removal rate of a subsequent, overlying aluminum layer, is critical. The thickness of the TiW layer, 13, was chosen to withstand the over etch cycle for the subsequent, overlying aluminum definition process. Again an alternative is to use a titanium nitride layer in place of TiW layer, 13. Finally another aluminum based layer, 14a, again containing between about 0.5 to 1.0% copper, and between about 0.5 to 1.0% silicon, is deposited via use of r.f. sputtering, again to a thickness between about 4000 to 10000 Angstroms. Layers 11, 12, 13, and 14a are deposited in situ, without breaking vacuum.

Figure 3:
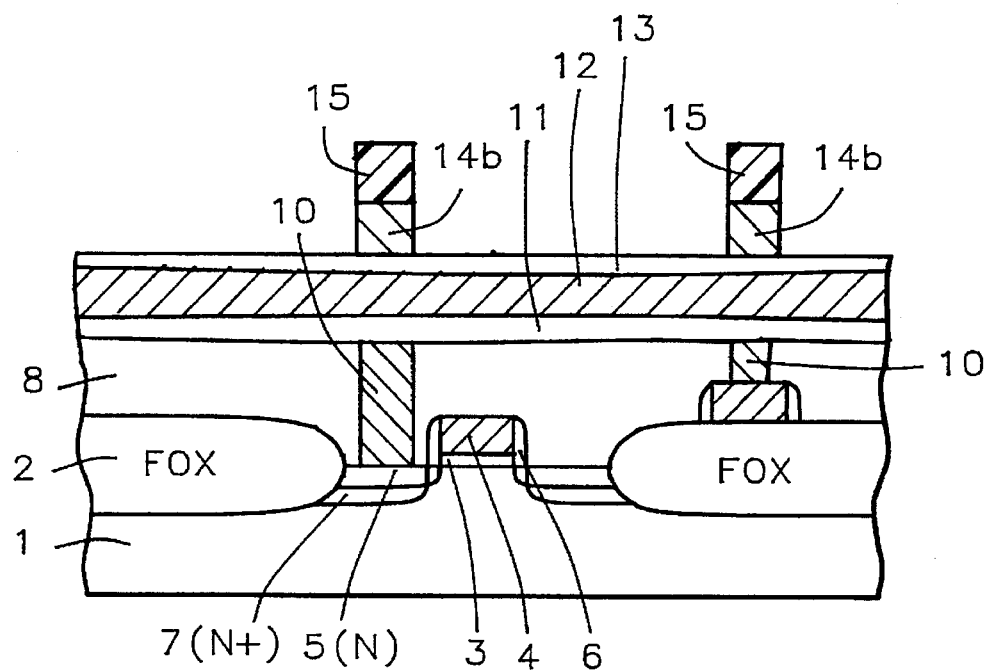
FIG. 3, which schematically shows the formation of the metal via structure, created using the top layer of the composite metallization layer.

The definition of a metal via structure, 14b, is next addressed, and shown schematically in FIG. 3. A photoresist shape, 15, is used as a mask to define metal via structure, 14b, from aluminum based layer, 14a, via RIE procedures, using Cl$_2$ and BCl$_3$. The removal rate of aluminum based layer, 14a, is between about 5000 to 10000 Angstroms/min., while the removal rate of TiW barrier layer, 13, is between about 300 to 1000 Angstroms/min. The slower removal rate of the TiW layer, 13, allows the use of this layer to function as an etch stop, allowing complete removal of aluminum layer, 14a, including an overetch cycle, without disturbing underlying, aluminum based layer, 12. The metal via structure, 14b, is created with a diameter between about 0.5 to 2.0 uM.

Figure 4:
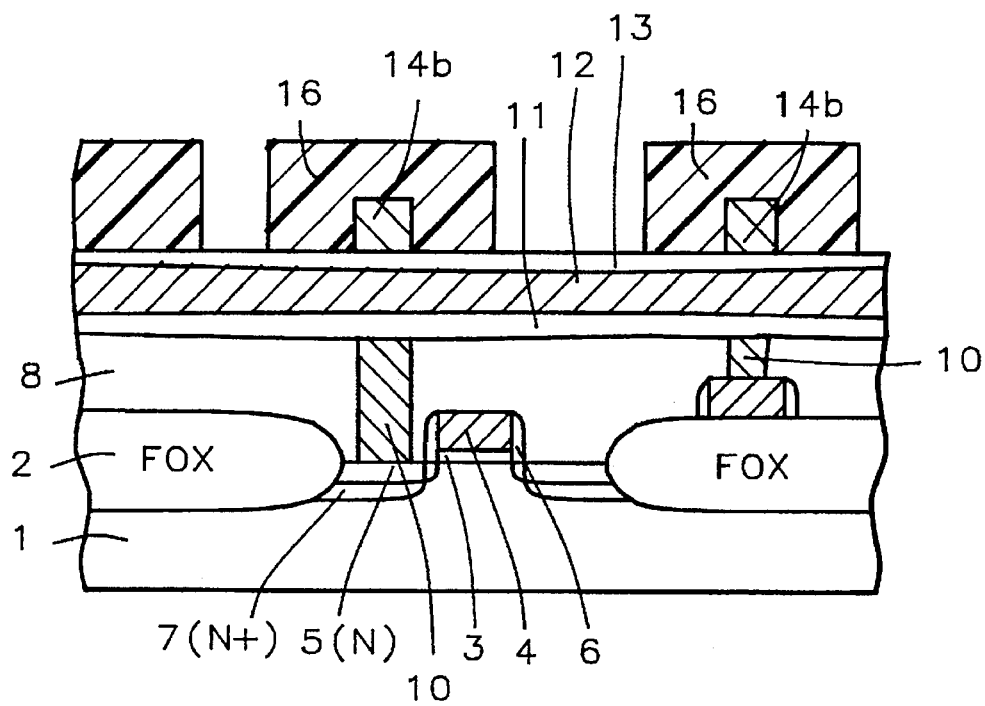
FIGS. 4–5, which schematically show the formation of an underlying interconnect metallization structure, created using the bottom layers of the composite metallization layer.
Figure 5:
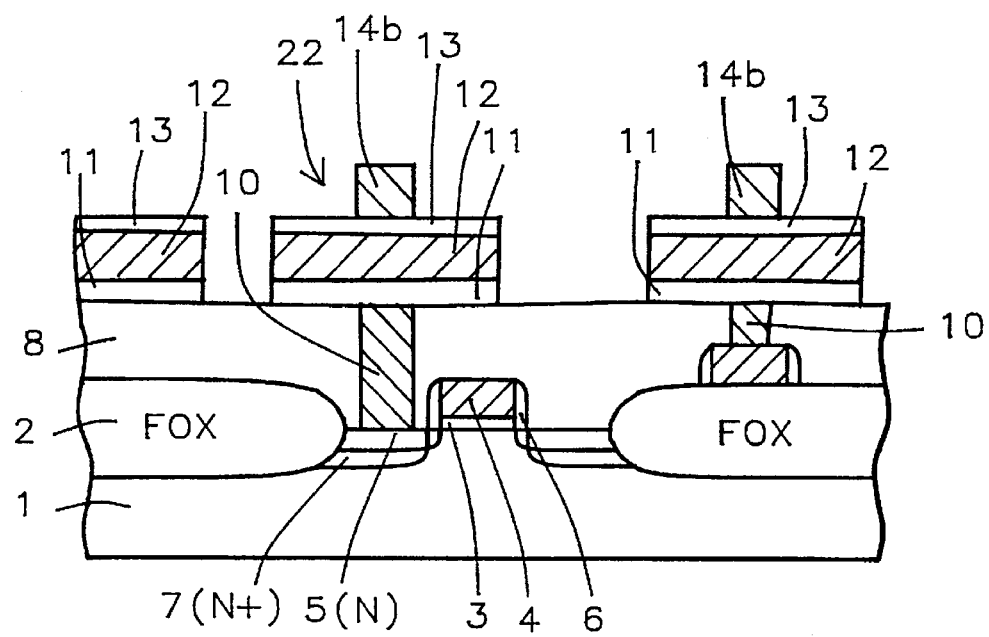

FIGS. 4–5, illustrate the creation of an underlying, composite interconnect metallization structure, 22. After removal of photoresist shape, 15, using plasma oxygen ashing and careful wet cleans, another photoresist shape, 16, is formed to provide the masking needed to create an underlying composite, interconnect metallization structure, 22. A RIE procedure, using $SF_6$ as an etchant for TiW barrier layer, 13, using $Cl_2$ and $BCl_3$ as etchants for aluminum based layer, 12, and again using $Cl_2$ and $BCl_3$ as an etchant to pattern titanium nitride layer, 11, is performed creating the underlying, composite interconnect metallization structure, 22, composed of TiW barrier layer, 13, aluminum based layer, 12, and titanium nitride layer, 11. FIG. 5, schematically shows the narrow, metal via structure, 14b, on the underlying, composite interconnect metallization structure, 22, after photoresist removal, accomplished via plasma oxygen ashing and careful wet cleans.

Figure 6:
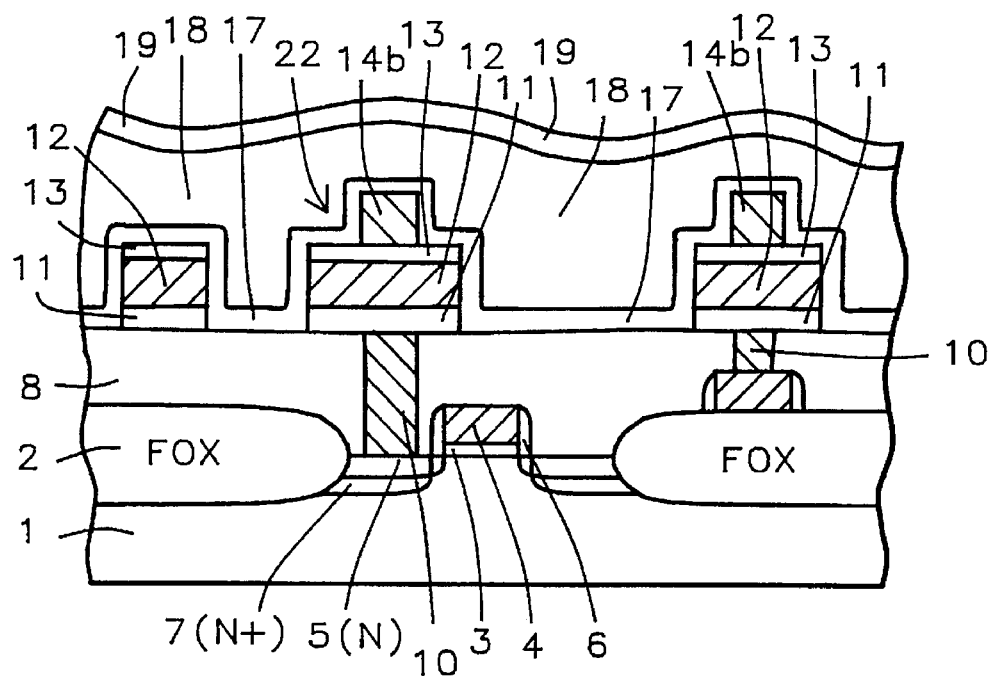
FIGS. 6–7, which schematically show the stages of processing used to fill the spaces between metal via structures, and between underlying interconnect structures, with a composite insulator layer.
Figure 7:
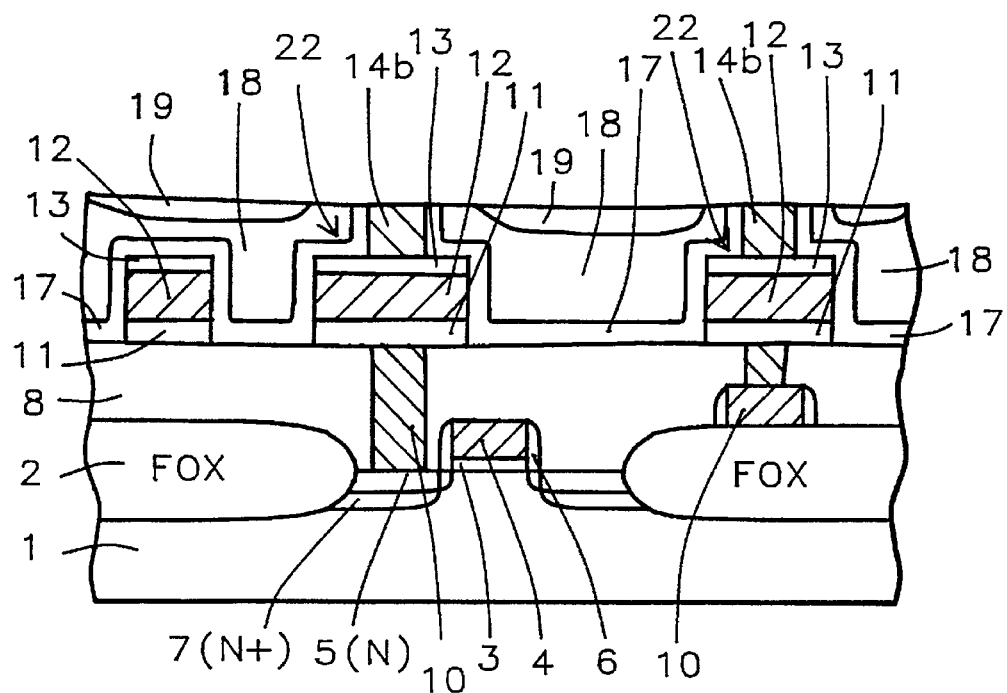

The filling of narrow spaces between metal via structures, 14b, and between underlying, interconnect metallization structures, 22, is next addressed and schematically described in FIGS. 6–7. Another critical aspect of this invention is to use a spin on glass, (SOG), layer to effectively fill the narrow spaces between metal structures, however without allowing the porous SOG material to interface the metal via structure, 14b. Therefore a first interlevel dielectric layer, 17, of silicon oxide, is initially deposited using PECVD processing, a temperature between about 300° to 500° C., to a thickness between about 4000 to 8000 Angstroms. The SOG layer, 18, providing excellent filling characteristics, is now applied using conventional methods to a thickness between about 3000 to 7000 Angstroms. SOG layer, 18, is subjected to a bake out at a temperature between about 100° to 200° C., and curing, at a temperature between about 250° to 450° C., for purposes of removing incorporated, volatile components from SOG layer, 18. The SOG layer can be replaced by other martials exhibiting the needed filling characteristics, such as polyimide, or high density plasma oxide. The complete filling of the spaces between metal structures is completed by the deposition of a second interlevel dielectric layer, 19, of silicon oxide, again deposited using PECVD processing, at a temperature between about 300° to 500° C., to a thickness between about 6000 to 12000 Angstroms. A chemical mechanical polishing procedure is next employed, using $NH_4OH$ or KOH silica slurry, to planarize the composite insulator, featuring SOG layer, 18. The chemical mechanical polishing procedure is performed to a point in which the top surface of metal via structure, 14b, is exposed. If an reactive ion etching procedure was used to expose the top surface of metal via structure, 14b, remaining volatile components from exposed portions of SOG layer, 18, could have reacted with the exposed top surface of metal via structure, 14b, creating interface resistance problems for subsequent overlying interconnect metallization structures.

Figure 8:
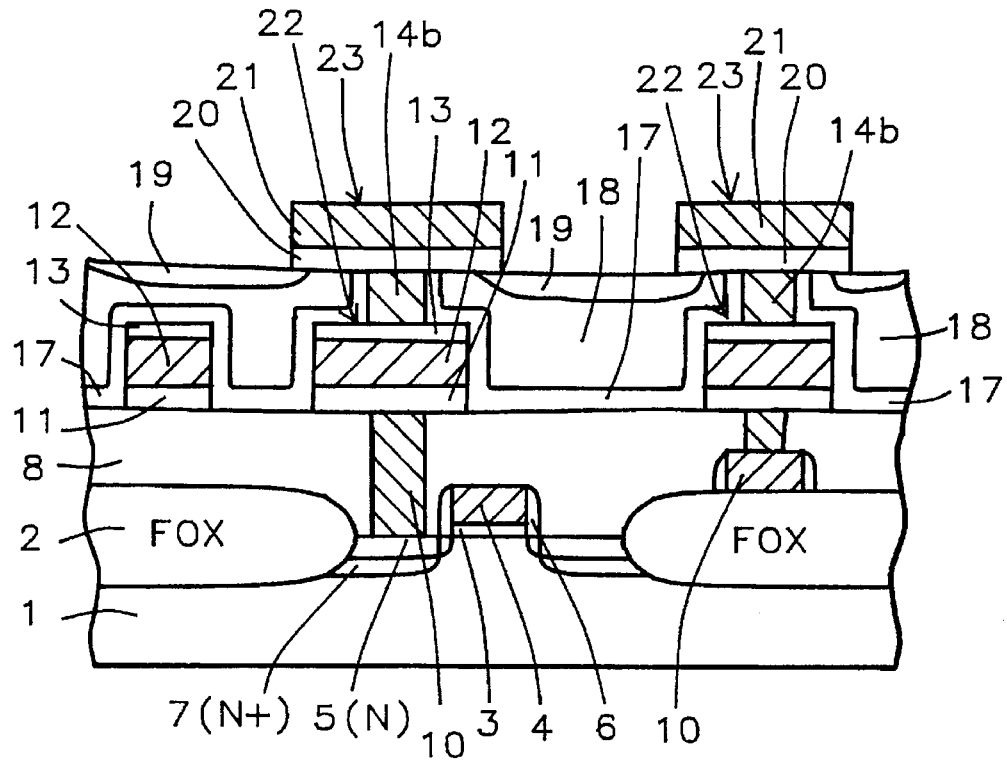
FIG. 8, which schematically shows the formation of an overlying interconnect metallization structure.

The formation of an overlying, interconnect metallization structure, is next addressed and shown schematically in FIG. 8. Another barrier layer of TiW, 20, is deposited using r.f. sputtering, to a thickness between about 500 to 1200 Angstroms. Again an alternative is to use a barrier layer of titanium nitride. An aluminum based layer, 21, containing between about 0.5 to 1.0% copper, and between about 0.5 to 1.0% silicon, is deposited using r.f. sputtering, to a thickness between about 6000 to 12000 Angstroms. Conventional photolithographic and RIE procedures, using $Cl_2$ and $BCl_2$ as etchants for aluminum based layer, 21, and $SF_6$ as an etchant for TiW barrier layer, 20, are used to create overlying, interconnect metallization structure, 23. This structure is schematically shown in FIG. 8, after photoresist removal, using plasma oxygen ashing and careful wet cleans. It can be seen in FIG. 8, that overlying interconnect metallization structure, 23, and underlying interconnect metallization structure, 22, are connected by metal via structure, 14b, with both metal via structure, 14b, and underlying interconnect metallization structure, 22, being formed from the same composite metallization layer.

This process for forming both metal via structures and metal interconnect structures, from a single composite metallization layer, although shown as connecting a first level interconnect structure to a second level interconnect structure, can also be applied to metal via structures connecting upper level interconnect structures. In addition this invention although shown as an application to NFET devices, can also be applied to P channel, (PFET), devices, complimentary, (CMOS), devices, and to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device structure, on a semiconductor substrate, using a metal via structure for electrical contact between multilevel interconnect metallizations structures, comprising the steps of:

providing active device regions in said MOSFET device structure, on said semiconductor substrate;

depositing an insulator layer on said semiconductor substrate, including depositing on said active device regions, of said MOSFET device structure;

opening a contact hole in said insulator layer, to expose top surface of said active device regions, in said MOSFET device structure;

depositing a contact hole fill layer on top surface of said insulator layer, completely filling said contact hole;

removing said contact hole fill layer from top surface of said insulator layer, forming a metal plug in said contact hole;

surface cleaning of said metal plug;

depositing a first barrier layer on top surface of said insulator layer, and on top surface of said metal plug;

depositing an underlying metallization layer on said first barrier layer;

depositing a second barrier layer on said underlying metallization layer;

depositing a overlying metallization layer on said second barrier layer;

forming a first photoresist shape on said overlying metallization layer;

etching of said overlying metallization layer, in regions not covered by said first photoresist shape, to create said metal via structure, on said second barrier layer;

removing said first photoresist shape;

forming a second photoresist shape on said second barrier layer, completely covering said metal via structure;

etching of said second barrier layer, of said underlying metallization layer, and of said first barrier layer, in regions not covered by said second photoresist shape, to create an underlying, composite interconnect metallization structure, underlying said metal via structure, and contacting underlying said metal plug;

removing said second photoresist shape;

depositing a first interlevel dielectric layer on said metal via structure, on said underlying, composite interconnect metallization structure, and on top surface of said insulator layer, not covered by said underlying, composite interconnect metallization structure;

applying a spin on glass layer on said first interlevel dielectric layer, partially filling spaces between said metal via structure, and between said underlying, composite interconnect metallization structure;

heat treating of said spin on glass layer;

curing of said spin on glass layer;

depositing a second interlevel dielectric layer, on said spin on glass layer, completely filling spaces between said metal via structure, and between said underlying, composite interconnect metallization structure;

chemical mechanical polishing to expose top surface of said metal via structure, and to planarize top surface of said first interlevel dielectric layer, top surface of said spin on glass layer, and top surface of said second dielectric layer;

depositing a third barrier layer on exposed top surface of said metal via structure, on top surface of said first interlevel dielectric layer, on top surface of said spin on glass layer, and on top surface of said second interlevel dielectric layer;

depositing a second level metallization layer, on said third barrier layer;

forming a third photoresist shape on said second level metallization layer;

etching of said second level metallization layer, and of said third barrier layer, in regions not covered by said third photoresist shape, to form a composite interconnect metallization structure, overlying said metal via structure; and removing said third photoresist shape.

2. The method of claim 1, wherein said first barrier layer is titanium nitride, deposited using r.f. sputtering, to a thickness between about 500 to 1200 Angstroms.

3. The method of claim 1, wherein said underlying metallization layer is aluminum, containing between about 0.5 to 1.0% copper, and between about 0.5 to 1.0% silicon, deposited using r.f. sputtering, to a thickness between about 4000 to 10000 Angstroms.

4. The method of claim 1, wherein said second barrier layer is titanium-tungsten, (TiW), deposited using r.f. sputtering, to a thickness between about 300 to 600 Angstroms.

5. The method of claim 1, wherein said overlying metallization layer is aluminum, containing between about 0.5 to 1.0% copper, and between about 0.5 to 1.0% silicon, to a thickness between about 4000 to 10000 Angstroms.

6. The method of claim 1, wherein etching of said overlying metallization layer is performed using reactive ion etching, using $Cl_2$ and $BCl_3$ as an etchant, at a removal rate between about 5000 to 10000 Angstroms/min., while underlying, said second barrier layer has a removal rate, between about 300 to 1000 Angstroms/min., when subjected to $Cl_2$ and $BCl_3$, at the conclusion of the etching cycle for said overlying metallization layer.

7. The method of claim 1, wherein said metal via structure, formed from said overlying metallization layer, is created with a diameter between about 0.5 to 2.0 micrometers.

8. The method of claim 1, wherein etching of said second barrier layer is performed using reactive ion etching, using $SF_6$ as an etchant, at a removal rate between about 1500 to 2500 Angstroms/min.

9. The method of claim 1, wherein etching of said underlying metallization layer is performed using reactive ion etching, using $Cl_2$ and $BCl_3$ as an etchant, at a removal rate between about 5000 to 10000 Angstroms/min.

10. The method of claim 1, wherein etching of said first barrier layer is performed using reactive ion etching, using $Cl_2$ and $BCl_3$ as an etchant, at a removal rate between about 1000 to 2000 Angstroms/min.

11. The method of claim 1, wherein said first interlevel dielectric layer is silicon oxide, deposited using PECVD processing, at a temperature between about 300° to 500° C., to a thickness between about 4000 to 8000 Angstroms.

12. The method of claim 1, wherein said spin on glass layer is applied to a thickness between about 3000 to 7000 Angstroms.

13. The method of claim 1, wherein said spin on glass layer is baked at a temperature between about 100° to 200° C., and cured at a temperature between about 250° to 450° C.

14. The method of claim 1, wherein said second interlevel dielectric layer is silicon dioxide, deposited at a temperature between about 300° to 500° C., to a thickness between about 6000 to 12000 Angstroms.

15. The method of claim 1, wherein said chemical mechanical polishing is performed using $NH_4OH$ or $KOH$ silica slurry.

16. A method for fabricating a MOSFET device structure, on a semiconductor substrate, using a metal via structure, formed from a composite metallization layer, to provide electrical contact between an underlying interconnect metallization structure, also formed from said composite metallization layer, and an overlying interconnect metallization structure, comprising the steps of:

providing active device regions in said MOSFET device structure, on said semiconductor substrate;

depositing an insulator layer on said semiconductor substrate, including depositing on said active device regions, of said MOSFET device structure;

opening a contact hole in said insulator layer, to expose top surface of said active device regions, in said MOSFET device structure;

depositing a tungsten layer on top surface of said insulator layer, completely filling said contact hole;

removing said tungsten layer from top surface of said insulator layer, forming a tungsten plug in said contact hole;

surface cleaning of said tungsten plug;

depositing a first titanium nitride barrier layer, on top surface of said insulator layer, and on exposed top surface of said tungsten plug;

depositing an underlying, aluminum based metal layer, on said first titanium nitride layer;

depositing a first titanium-tungsten barrier layer on said underlying, aluminum based metal layer;

depositing an overlying, aluminum based metal layer, on said first titanium-tungsten barrier layer;

forming a first photoresist shape on said overlying, aluminum based metal layer;

etching of said overlying, aluminum based metal layer, in regions not covered by said first photoresist shape, with etch stopping at said first titanium-tungsten barrier layer, to create said metal via structure, on said first titanium-tungsten barrier layer;

removing said first photoresist shape;

forming a second photoresist shape on said first titanium-tungsten barrier layer, completely covering said metal via structure;

etching of said first titanium-tungsten barrier layer, of said underlying, aluminum based metal layer, and of said first titanium nitride layer, in regions not covered by said second photoresist shape, to create an underlying, composite interconnect metallization structure, underlying said metal via structure, while contacting underlying said tungsten plug;

removing said second photoresist shape;

depositing a first silicon oxide layer on said metal via structure, on said underlying, composite interconnect metallization structure, and on top surface of said insulator layer, not covered by said underlying, composite interconnect metallization structure;

applying a spin on glass layer on said first silicon oxide layer, partially filling spaces between said metal via structure, and between said underlying, composite interconnect metallization structure;

heat treating of said spin on glass layer;

curing of said spin on glass layer;

depositing a second silicon oxide layer on said spin on glass layer, completely filling spaces between said metal via structure, and between said underlying, composite interconnect metallization structure;

chemical mechanical polishing to expose top surface of said metal via structure, and to planarize top surface of said first silicon oxide layer, top surface of said spin on glass layer, and top surface of said second silicon oxide layer;

depositing a second titanium-tungsten barrier layer on exposed top surface of said metal via structure, and on top surface of said first silicon oxide layer, on top surface of said spin on glass layer, and on top surface of said second silicon oxide layer;

depositing a second level, aluminum based layer, on said second titanium-tungsten barrier layer;

forming a third photoresist shape on said second level, aluminum based layer;

etching of said second level, aluminum based layer, and of said second titanium-tungsten barrier layer, in regions not covered by said third photoresist shape, to create an overlying, composite interconnect metallization structure, contacting underlying, said metal via structure; and removing said third photoresist shape.

17. The method of claim 16, wherein said first titanium nitride layer is deposited using r.f. sputtering, to a thickness between about 500 to 1200 Angstroms.

18. The method of claim 16, wherein said underlying, aluminum based layer, is aluminum, containing between about 0.5 to 1.0% copper, and between about 0.5 to 1.0% silicon, deposited using r.f. sputtering, to a thickness between about 4000 to 10000 Angstroms.

19. The method of claim 16, wherein said first titanium-tungsten barrier layer is deposited using r.f. sputtering, to a thickness between about 300 to 600 Angstroms.

20. The method of claim 16, wherein overlying, aluminum based metal layer, is aluminum, containing between about 0.5 to 1.0% copper, and between about 0.5 to 1.0% silicon, deposited using r.f. sputtering, to a thickness between about 4000 to 10000 Angstroms.

21. The method of claim 16, wherein etching of said overlying, aluminum based metal layer, is performed using reactive ion etching, using $Cl_2$ and $BCl_3$ as an etchant, with a removal rate between about 5000 to 10000 Angstroms/min., while underlying, said first titanium-tungsten barrier layer has a removal rate between about 300 to 1000 Angstroms/min., when subjected to $Cl_2$ and $BCl_3$, at the conclusion of etching cycle for said overlying, aluminum based metal layer.

22. The method of claim 16, wherein said metal via structure, formed from said overlying, aluminum based metal layer, is created with a diameter between about 0.5 to 2.0 micrometers.

23. The method of claim 16, wherein etching of said first titanium-tungsten barrier layer, is performed using reactive ion etching, using $SF_6$ as an etchant, with a removal rate between about 1500 to 2500 Angstroms/min.

24. The method of claim 16, wherein etching of said underlying, aluminum based layer, is performed using reactive ion etching, using $Cl_2$ and $BCl_3$ as an etchant, with a removal rate between about 5000 to 10000 Angstroms/min.

25. The method of claim 16, wherein etching of said first titanium nitride layer, is performed using reactive ion etching, using $Cl_2$ and $BCl_3$ as an etchant, with a removal rate between about 1000 to 2000 Angstroms/min.

26. The method of claim 16, wherein said first silicon oxide layer is deposited using PECVD processing, at a temperature between about 300° to 500° C., to a thickness between about 4000 to 8000 Angstroms.

27. The method of claim 16, wherein said spin on glass layer is applied to a thickness between about 3000 to 7000 Angstroms.

28. The method of claim 16, wherein said spin on glass layer is baked at a temperature between about 100° to 200° C., and cured at a temperature between about 250° to 450° C.

29. The method of claim 16, wherein said second silicon oxide layer is deposited using PECVD processing, at a temperature between about 300° to 500° C., to a thickness between about 6000 to 12000 Angstroms.

30. The method of claim 16, wherein said chemical mechanical polishing is performed using $NH_4OH$ or KOH silica slurry.

* * * * *